United States Patent [19]

Mutrux

[11] 4,242,745
[45] Dec. 30, 1980

[54] ELECTRONIC TIMEPIECE WITH ELECTROACOUSTIC TRANSDUCER

[75] Inventor: Claude Mutrux, Marin, Switzerland

[73] Assignee: Ebauches Electroniques SA, Marin, Switzerland

[21] Appl. No.: 968,919

[22] Filed: Dec. 13, 1978

[30] Foreign Application Priority Data

Dec. 23, 1977 [CH] Switzerland .................. 15935/77

[51] Int. Cl.³ .................. G04B 23/02; G04B 17/00; G04C 21/16
[52] U.S. Cl. .................. 368/73; 368/184; 368/255
[58] Field of Search .................. 58/23 R, 57.5, 23 BA; 368/63, 255, 184, 73

[56] References Cited

U.S. PATENT DOCUMENTS

| | | | |
|---|---|---|---|
| 3,759,029 | 9/1973 | Komaki | 58/38 |
| 3,855,574 | 12/1974 | Welty | 340/148 |
| 3,919,834 | 11/1975 | Murakawi | 58/14 |
| 3,944,736 | 3/1976 | Shepard | 178/6.8 |
| 4,020,628 | 5/1977 | Vittoz | 58/145 K |
| 4,078,376 | 3/1978 | Freeman | 58/38 R |
| 4,091,302 | 5/1978 | Yamashita | 310/339 |
| 4,101,838 | 7/1978 | Aihara et al. | 328/63 |

FOREIGN PATENT DOCUMENTS 846620 1/1977 Belgium .

*Primary Examiner*—J. V. Truhe
*Assistant Examiner*—John B. Conklin
*Attorney, Agent, or Firm*—Wender, Murase & White

[57] ABSTRACT

The invention relates to an electronic timepiece provided with an electroacoustic transducer for transmitting acoustic signals to indicate a time of alarm, and also for receiving information in the form of acoustic signals to control different functions of the timepiece.

Coded acoustic information is delivered to the transducer, for example, by a special apparatus intended for that purpose, and serve to control different functions of the timepiece through a watch and transducer control logic network. The logic network is interconnected with the frequency divider chain, a display control circuit, and a transducer. The logic network includes a selector which connects the transducer either to the output of an alarm logic circuit for delivering alarm signals to the transducer at the time of alarm, or to a transducer detector for transmitting the electrical signals delivered by the transducer acting as a microphone to a watch logic circuit. The watch logic circuit, in turn, controls the alarm logic circuit, the frequency divider chain, and the display control circuit of the timepiece.

6 Claims, 7 Drawing Figures

ELECTRONIC TIMEPIECE WITH ELECTROACOUSTIC TRANSDUCER

BACKGROUND OF THE INVENTION

The present invention relates to an electronic timepiece comprising an electroacoustic transducer, an oscillator, a frequency divider chain, a display control circuit, a display, and an alarm system which includes a transducer capable of operating as an emitter of acoustic signals in response to excitation signals delivered to it, and an electronic circuit activated by the frequency divider chain for generating the excitation signals.

Timepieces are already known which include an electroacoustic transducer for delivering an acoustic signal at a time of alarm. Generally, in such timepieces, the transducer is designed only to emit acoustic signals, but not to receive such signals. However, it would be useful to use such a transducer both ways; that is, not only to transmit alarm signals, but also to receive external information in the form of acoustic signals for controlling different functions of the timepiece. Such information signals could be, for example, those which are normally given to the timepiece using conventional control means like push-buttons.

There is described in U.S. Pat. No. 4,020,628 an electronic watch comprising a receiver of acoustic or magnetic signals delivered by a telephone apparatus adapted to this end. The timepiece is placed close to the telephone apparatus, and the coded signals collected are utilized to automatically correct the variation of rate of the timepiece, or to set the time.

However, the receiver of acoustic signals of such a timepiece is not designed to emit acoustic signals. Thus it cannot be utilized to acoustically signal a time of alarm.

In U.S. Pat. No. 3,855,574 a device is described which is not an electronic timepiece but rather an alarm system which is capable of being switched off acoustically. The alarm rings until a verbal order is given. After a predetermined time the alarm signal is again switched on until a new verbal order is given. The process repeats itself until either a push-button is actuated in order to shut off the alarm, or until an automatic reset of the device is accomplished by the mechanism of the device.

However, such a device is in fact an acoustically controlled alarm switch. It needs both microphone and loudspeaker elements, and does not avoid the necessity of including an extra element for shutting off the alarm.

It is, therefore, an object of the present invention to provide an electronic timepiece with an electroacoustic transducer able to transmit acoustic signals to indicate a time of alarm, and being further able to receive information in the form of acoustic signals to control different functions of the timepiece.

SUMMARY OF THE INVENTION

The timepiece according to the present invention comprises an oscillator, a frequency divider chain, a display control circuit, a display and an alarm system including a transducer capable of operating as an emitter of acoustic signals in response to excitation signals delivered to it. Also included is an electronic circuit activated by the frequency divider chain to generate the excitation signals, wherein The transducer is further able to convert acoustic signals it receives into electrical signals, and the timepiece includes logic means which respond to the electrical signals for controlling different functions of the timepiece.

The invention will be described further by way of example with reference to the accompanying drawings.

DESCRIPTION OF THE PREFERRED EMBODIMENT

Figure 1:
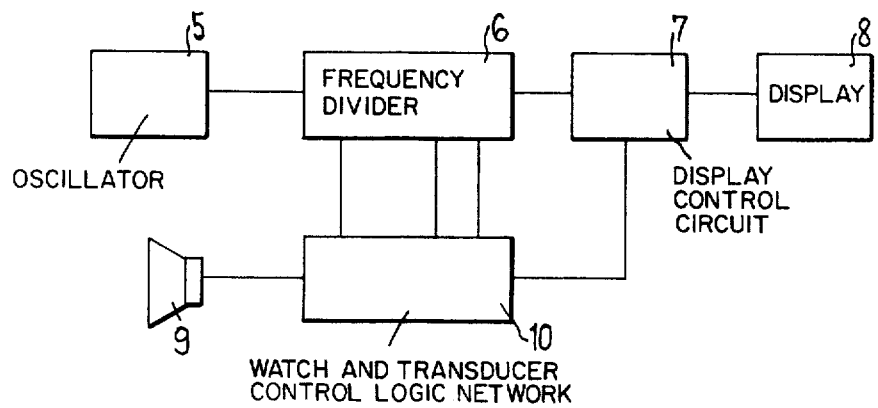
FIG. 1 is a block diagram of a preferred embodiment of an electronic timepiece having an electroacoustic transducer according to the present invention.

FIG. 1 shows that beside the conventional elements such as an oscillator 5, the frequency divider chain 6, the display control circuit 7, and the display unit 8, the timepiece according to the present invention also includes a transducer 9 connected to a watch and transducer control logic network 10.

Figure 2:
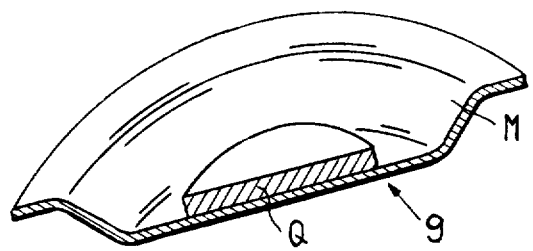
FIG. 2 is a perspective cut-away view of one embodiment of the transducer of the electronic timepiece according to the present invention.

FIG. 2 is a perspective cut-away view of a preferred embodiment of the transducer 9 of FIG. 1. The transducer 9 comprises a piezoelectric disc element Q mounted on a metallic membrane M. The element Q is the component used both for the indication of alarm time, as well as for the reception and collection of acoustic signals such as a human voice, noise, or mechanical shocks exerted manually on the timepiece.

The logic network 10 may include elements necessary for controlling the different functions of the timepiece; e.g., a memory for storing the time of alarm, circuits for selecting the appropriate logic signals present in the frequency divider chain, and a comparator to compare these logic signals with the stored time of alarm. It may also include circuits for detecting and combining of pulses in order to generate one or more alarm frequencies at regular intervals. It may further include one or more frequency detecting circuits for transforming a series of data signals delivered in the form of a sequence of two different frequencies into a sequence of logic states O and L. Also, there may be included one or more coding and inhibiting systems to prevent any noise collected by the transducer 9 which is unwanted from acting on the logic network 10. The logic network 10 is connected to different terminals of the frequency divider chain 6, to the display control circuit 7, and to the transducer 9.

Figure 3:
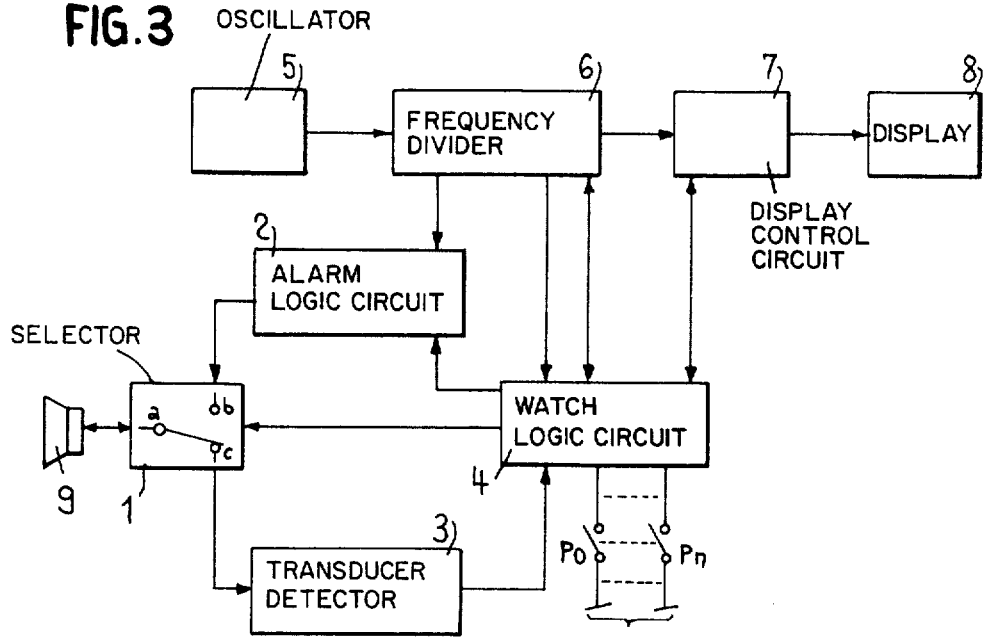
FIG. 3 is a block diagram of the electronic timepiece showing a preferred embodiment of the transducer control logic network 10 of FIG. 1 according to the present invention.

FIG. 3 is a block diagram of a preferred embodiment of the logic network 10 of FIG. 1. The transducer 9 is connected to the terminal a of an electronic selector 1, the terminal b of which is connected to the output of an alarm logic circuit 2, and the terminal c of which is connected to the input of a transducer detecter 3. The selector is controlled by the output signals of a watch logic circuit 4. The watch logic circuit 4 is interconnected, as shown schematically in FIG. 3, with the alarm logic circuit 2, the transducer detector 3, the frequency divider chain 6, and the display control circuit 7. If necessary, control means (e.g., push-buttons Po-Pn) may be connected to the watch logic circuit 4.

Figure 4:
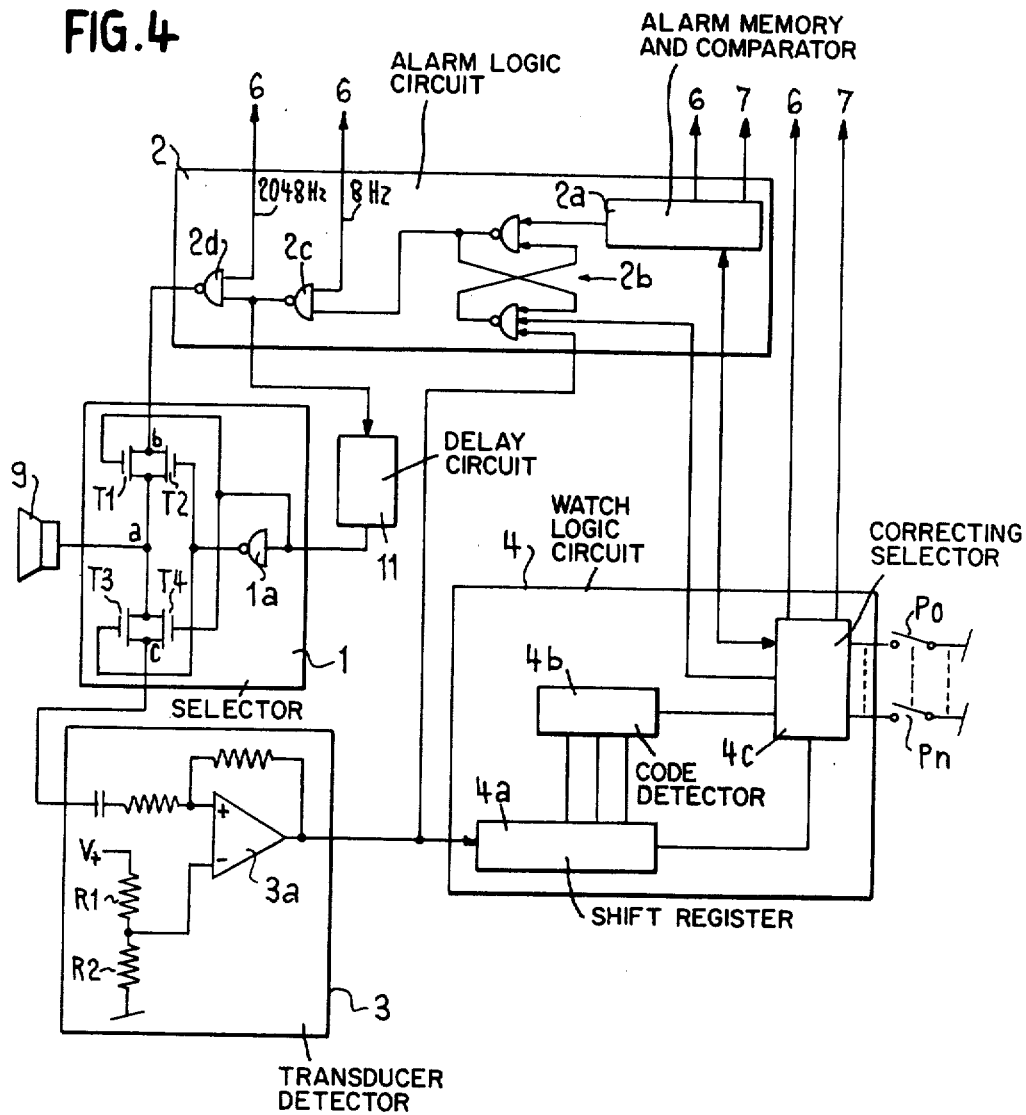
FIG. 4 is a schematic diagram partially in block form of a preferred embodiment of the components of the network shown as the blocks 1-4 of the block diagram of FIG. 3 according to the present invention.

FIG. 4 is a schematic diagram partially in block form of the network, showing in more detail the electronic circuits represented by blocks 1-4 of FIG. 3.

The electronic selector circuit 1 comprises two pairs of CMOS transistors T1, T2 and T3, T4 respectively, and a NAND GATE 1a for controlling the transistors. For a given logic state at the input of gate 1a, both transistors of the first pair T1, T2 are conducting, while both transistors of the second pair T3, T4 are closed. When the logic state changes over at the input of gate 1a, the second pair T3, T4 is activated and the first pair T1, T2 is closed. When the transistor pair T3, T4 is activated, the transducer 9 is connected to the input of the transducer detector 3, and the transducer thus behaves like a microphone for receiving external sounds.

The alarm logic circuit 2 comprises an alarm memory and comparator circuit 2a which is connected to the frequency divider chain 6, the control display 7, to an output of the watch logic circuit 4. The output of circuit 2a switches on a flip-flop 2b comprising two NAND gates. The flip-flop 2b may be switched off, either by one of the push-buttons Po-Pn through the logic circuit 4, or by the transducer 9 through the transducer detector 3. The output of flip-flop 2b controls a logic circuit comprising two NAND gates 2c and 2d which receive pulse signals of different frequencies from the frequency divider chain. The gates 2c and 2d generate the alarm pulse signal to control the transducer 9, and a control signal for a delay circuit 11. The output signal of delay circuit 11 serves as the control signal for gate 1a of selector 1. The role of the delay circuit 11 is to prevent the alarm signal from shutting itself off. It is clear that the logic circuit which comprises the gates 2c and 2d would be different if another more complicated musical alarm signal was to be generated.

The transducer detector 3 comprises an operational amplifier 3a which works as a level detector with the divider R1, R2 and delivers an output signal only if the level of the input signal delivered by the transducer 9 is sufficient to reach the threshold determined by the resistors R1, R2. The output signal of the detector 3 controls the flip-flop 2b of the alarm logic circuit 2, and the input of the watch logic circuit 4.

The watch logic circuit 4 comprises a shift register 4a which receives input data delivered by the detector 3. A code detector 4b checks the input data in the shift register 4a and delivers a signal to a correcting selector 4c when the information memorized in the shift register corresponds to a meaningful preselected value. This then actuates the correcting selector in the same way as the push-buttons Po-Pn for controlling the desired function of the timepiece. The output of the correcting selector 4c is connected to the frequency divider chain 6, the display control circuit 7, the alarm memory and comparator 2a, and to the flip-flop 2b of the alarm logic circuit 2. The push-buttons Po-Pn are connected to a corresponding set of inputs of the correcting selector 4c.

Let us examine now the different possible applications of the system comprising a transducer 9, and a watch and transducer control logic network 10.

1. The alarm is stopped by an acoustic signal given to the transducer

Figure 5:
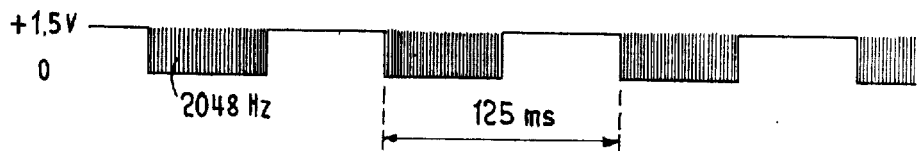
FIG. 5 is a pulse diagram of the electric signal which controls the alarm of the timepiece according to the present invention.

With reference to FIG. 4, the operation of the circuit is as follows. The hour and minute of alarm are memorized in the alarm memory and comparator 2a of alarm logic circuit 2, and are compared by circuit 2a with the time measured by the frequency divider chain 6. The memorized time of alarm may be displayed on command by the display circuit 7. When the time of alarm coincides with the time measured in the frequency divider chain, the alarm memory and comparator circuit 2a delivers an output signal which switches on the flip-flop 2b, which causes logic 2c, 2d to deliver an alarm signal through the transistors T1, T2 to the transducer 9, which works as a loudspeaker to sound an alarm. Through the delay circuit 11, the gate 1a receives a control signal which activates the transistors T1, T2. FIG. 5 is a pulse diagram showing an example of an electric alarm signal as delivered through the transistors T1, T2 to the transducer 9. It is to be seen that this alarm signal is composed of pulse trains having a repetition frequency of 2048 Hz and a duration of 62.5 milliseconds (corresponding to one-half of the period of the 8 Hz signal at gate 2c), which are separated by pulseless intervals of 62.5 milliseconds. During these intervals, the gate 1a receives the complementary logic signal, and the transistors T3, T4 are activated while the transistors T1, T2 are closed. The transducer may therefore function as a microphone and transmit an electrical signal to the input of the transducer detector which is a function of an acoustic signal. If the level of the signal delivered to the transducer detector 3 is sufficient, the detector delivers an output signal to the flip-flop 2b of the alarm logic circuit 2. The flip-flop 2b switches over and stops the alarm signal at the output of gate 2d. When this is completed, the alarm has been stopped by an acoustic signal generated from outside the timepiece and received by the transducer. If the level of the signal delivered to the transducer detector by the transducer is not sufficient, the detector does not deliver an output signal to the alarm logic circuit 2. Thus, when the next pulse of 8 Hz appears at the output of gate 2c, the gate 1a is again switched over to its initial state wherein the transistors T1, T2 are activated, and the transducer again functions as a loudspeaker for the alarm signal.

Figure 6:
FIG. 6 is a representation of one possible musical alarm signal produced by the timepiece in accordance with the present invention.

FIG. 6 is a representative of one possible musical alarm signal which may be used to control the transducer 9 to indicate a time of alarm.

2. Automatic time setting of the timepiece

In this case, the coincidence between the contents of the memory of the circuit 2a and that of the frequency divider chain 6 does not exist, and the selector 1 of FIG. 4 is permanently in a condition where transistors T3, T4 are activated, while transistors T1, T2 are closed. In other words, the transducer acts as a microphone for the acoustic signals it receives from outside the timepiece, and delivers signals at the input of the detector 3. The timepiece may be placed, for example, on a special apparatus which delivers coded acoustic signals to the transducer 9. The acoustic information delivered to the transducer 9 may replace the information which is normally delivered to the timepiece by the push-buttons Po-Pn. The signal at the output of the detector 3 is entered into the shift register 4a of the logic circuit 4. The code detector 4b checks the information memorized in the shift register 4a to ascertain if it properly corresponds to a preselected code for effecting some operation to be performed in the timepiece. If the coded information is proper, the code detector delivers a signal to the correcting selector 4c, and the information memorized in the shift register 4a acts on the correcting selector 4c causing it to automatically perform the time setting operation on the display control circuit 7 of FIG. 3. The coded acoustic signals may be provided, for example, by a sequence of two pulse trains of different repetition frequencies which appear in a preselected order, similar to a sequence of the two logic states O and L of a logic word. As an example, one or both repetition frequencies may be used to select the function or operation of time setting, while the order of succession of the two frequencies is an indication in binary code of the time to which the timepiece is to be set.

3. Automatic selection and control of other functions of the timepiece

The same principle may also be applied to the selection and control of other functions of the timepiece, such as the modification of an indicated time zone, or the correction of the variation of rate of the timepiece.

In the latter case, the variation of rate is normally corrected by directed adjustment of the oscillator, or by changing the division ratio of the frequency divider chain. This is typically effected by at least one push-button. According to the present invention, the transducer receives the acoustic information which may be delivered by an apparatus intended for that purpose, so that the transducer could replace the push-button of the conventional watch. As previously discussed, the function of correction of the variation of rate of the frequency divider chain 6 by the correcting selector 4c could be selected by the repetition frequencies of the pulse trains, and the amount of correction could be determined by the order of succession of the different frequencies. In this way the push-button is replaced by the transducer without any additional discrete element since the transducer is already included in the timepiece as a loudspeaker for emitting the alarm sound signal.

4. Utilization of the transducer to recharge the battery of the timepiece

Figure 7:
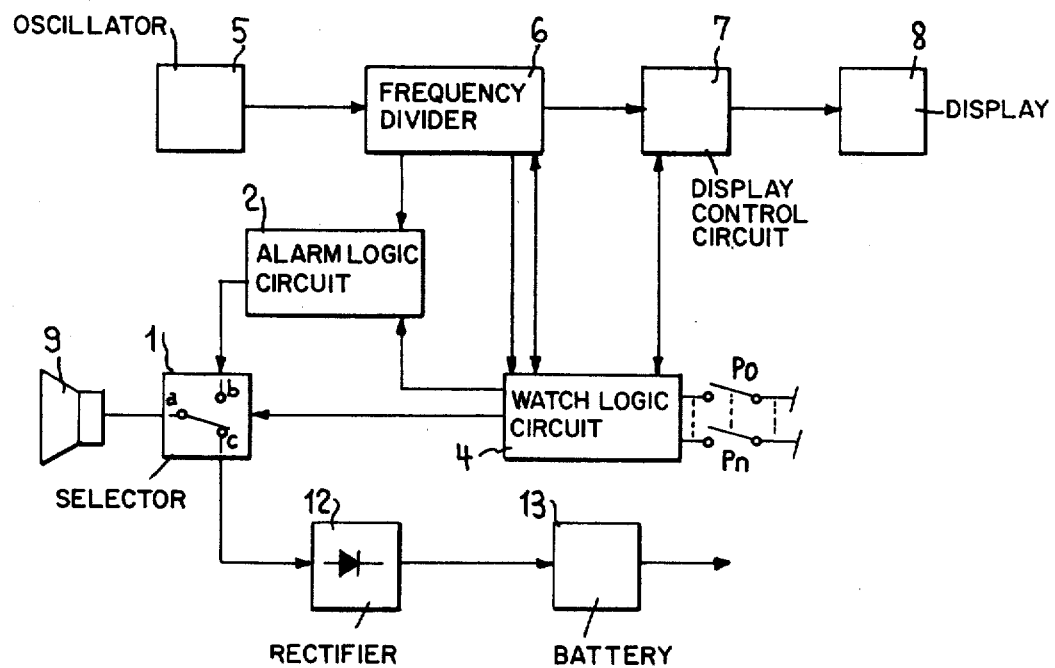
FIG. 7 is a block diagram of an alternate embodiment of the electronic timepiece in accordance with the present invention, in which the transducer is utilized to recharge the battery.

FIG. 7 is a block diagram of the timepiece in which the transducer is utilized to recharge the battery. When the alarm does not function, the selector 1 is in position a-c. The transducer thus behaves like a microphone, and is connected through a rectifier 12 to the battery 13 of the timepiece. Each time the transducer receives sound vibrations generated from outside the timepiece, such as noise, a human voice, or mechanical shocks, it delivers electrical energy in the form of an output signal which is used, after rectification, to recharge the battery.

From the preceding, it is clear that control of the functions of the timepiece by the transducer acting as a microphone eliminates the need for additional function control elements. Nevertheless, the timepiece may include control elements, such as push-buttons, to be used as an alternative to the transducer for manual control of the functions of the timepiece.

What I claim is:

1. An electronic timepiece having an alarm means and including a time base source supplying signals to a display control circuit for controlling a display, comprising:

an electroacoustic transducer capable of emitting acoustic signals of audible frequencies in response to electrical audio frequency output signals and of producing electrical audio frequency input signals in response to received acoustic signals of audible frequencies; and a watch and transducer control logic network coupled to said time base pulse source, said display control circuit, and said electroacoustic transducer, said control logic network including first means coupled to said time base pulse source for generating said electrical audio frequency output signals;

said control logic network including second means responsive to said electrical audio frequency input signals produced by said transducer for effecting a change in a predetermined operative condition of the timepiece;

said control logic network further including selector means normally operatively connecting said electroacoustic transducer to said second means whereby said transducer normally functions as a receiver of said acoustic signals of audible frequencies, said selector means further being responsive to activation of said alarm means for alternatively operatively connecting said transducer, alternately to said first means thereby causing said transducer to emit an acoustic alarm signal in response to said electrical audio frequency output signals, and to said second means thereby causing said transducer to receive said acoustic signals, thus permitting at least one operative condition of the timepiece to be controlled by an acoustic signal of audio frequency.

2. The invention as recited in claim 1, wherein said control logic network further comprises:

an alarm logic circuit coupled to said time base pulse source for delivering said electrical audio frequency output pulse signals to said transducer at a preselected time of alarm;

a detector circuit responsive to said electrical audio frequency input signals produced by said transducer for generating a control signal; and a watch logic circuit connected to said detector circuit for receiving said control signal, and connected to said alarm logic circuit for stopping said electrical audio frequency output pulse signals to said transducer in response to said acoustic signals of audible frequencies.

3. The invention as recited in claim 1, wherein said control logic network comprises a rectifier responsive to said electrical audio frequency input signals produced by said transducer for recharging the battery of said timepiece.

4. The invention as recited in claim 1, wherein said acoustic signals received by the transducer are words of the human voice.

5. The invention as recited in claim 1, wherein said control logic network comprises at least one decoding and inhibiting circuit for preventing unwanted noise collected by the transducer from causing said control logic network to effect a change in the operative condition of said timepiece.

6. An electronic timepiece having a time base pulse source feeding a time display and a watch logic circuit for performing alarm and timekeeping functions, comprising:

first means coupled to said time base pulse source for generating electrical audio frequency output signals;

an electroacoustic transducer capable of emitting acoustic signals in response to said electrical audio frequency output signals and of receiving acoustic audio frequency signals for producing electrical audio frequency input signals;

selector means connected to said first means and to said transducer for delivering said electrical audio frequency output signals to said transducer, said selector means being responsive to signals produced by said watch logic circuit for operatively connecting said transducer as a receiver of said acoustic signals; and detector means connected to said selector means for receiving said electrical audio frequency input signals from said transducer, said detector means delivering a control signal to said watch logic circuit thereby effecting a change in the operative condition of the timepiece in response to said acoustic audio frequency signal received by said electroacoustic transducer.

* * * * *